(12) United States Patent
Moise, IV et al.

(10) Patent No.: US 7,935,543 B2
(45) Date of Patent: May 3, 2011

(54) METHOD OF FORMING PZT FERROELECTRIC CAPACITORS FOR INTEGRATED CIRCUITS

(75) Inventors: Theodore S. Moise, IV, Dallas, TX (US); Scott R. Summerfelt, Garland, TX (US); Kezhakkedath R. Udayakumar, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/472,265

(22) Filed: May 26, 2009

(65) Prior Publication Data

US 2009/0233382 A1   Sep. 17, 2009

Related U.S. Application Data

(62) Division of application No. 10/749,668, filed on Dec. 30, 2003, now abandoned.

(51) Int. Cl.
*H01L 21/00* (2006.01)
(52) U.S. Cl. .......................................... 438/3; 257/295
(58) Field of Classification Search ........................ None
See application file for complete search history.

(56) References Cited

U.S. PATENT DOCUMENTS

| 5,382,817 | A | 1/1995 | Kashihara et al. |
| 6,211,035 | B1 | 4/2001 | Moise et al. |
| 6,316,797 | B1 | 11/2001 | Van Buskirk et al. |
| 6,507,060 | B2 | 1/2003 | Ren et al. |
| 6,514,835 | B1 | 2/2003 | Hendrix et al. |
| 6,627,930 | B1 | 9/2003 | Fox et al. |
| 6,831,313 | B2 | 12/2004 | Uchiyama et al. |
| 6,841,817 | B2 | 1/2005 | Kurasawa et al. |
| 6,914,282 | B2 | 7/2005 | Lung |
| 2003/0146287 | A1 | 8/2003 | Maruyama |
| 2003/0162394 | A1* | 8/2003 | Takemura ..................... 438/689 |

* cited by examiner

*Primary Examiner* — Wael M Fahmy
*Assistant Examiner* — Abul Kalam
(74) *Attorney, Agent, or Firm* — Warren L. Franz; Wade J. Brady, III; Frederick J. Telecky, Jr.

(57) ABSTRACT

One aspect of the invention relates to a method of manufacturing an integrated circuit comprising forming an array of ferroelectric memory cells on a semiconductor substrate, heating the substrate to a temperature near a Curie temperature of the ferroelectric cores, and subjecting the substrate to a temperature program, whereby thermally induced stresses on the ferroelectric cores cause a switched polarization of the cores to increase by at least about 25% as the cores cool to about room temperature. Embodiments of the invention include metal filled vias of expanded cross-section above and below the ferroelectric cores, which increase the thermal stresses on the ferroelectric cores during cooling.

20 Claims, 2 Drawing Sheets

METHOD OF FORMING PZT FERROELECTRIC CAPACITORS FOR INTEGRATED CIRCUITS

This application is a division of U.S. application Ser. No. 10/749,668, filed Dec. 30, 2003, the entirety of which is incorporated herein by reference.

BACKGROUND

This relates generally to the field of integrated circuit manufacturing and, more particularly, relates to ferroelectric RAM.

Ferroelectric memory and other types of semiconductor memory are used for storing data and/or program code in personal computer systems, embedded processor-based systems, and the like. Ferroelectric memories are commonly organized in single-transistor, single-capacitor (1T1C) or two-transistor, two-capacitor (2T2C) configurations, in which data is read from or written to the device using address signals and various other control signals. The individual memory cells typically comprise one or more ferroelectric (FE) capacitors adapted to store a binary data bit, as well as one or more access transistors, typically MOS devices, operable to selectively connect the FE capacitor to one of a pair of complementary bit lines, with the second bit line being connected to a reference voltage. The individual cells are commonly organized as individual bits of a corresponding data word, wherein the cells of a given word are accessed concurrently through activation of plate lines and word lines by address decoding circuitry.

Ferroelectric memory devices provide non-volatile data storage. Ferroelectric memory cells include capacitors constructed with ferroelectric dielectric material that may be polarized in one direction or another in order to store a binary value. The ferroelectric effect allows for the retention of a stable polarization in the absence of an applied electric field due to the alignment of internal dipoles within the dielectric material. This alignment may be selectively achieved by application of an electric field to the ferroelectric capacitor in excess of the coercive field of the material. Conversely, reversal of the applied field reverses the internal dipoles. The response of the polarization of a ferroelectric capacitor to the applied voltage may be plotted as a hysteresis curve.

As illustrated in prior art FIG. 1, a 1T/1C FeRAM cell 10 includes one transistor 12 and one ferroelectric storage capacitor 14. A bottom electrode of the storage capacitor 14 is connected to a drain terminal 15 of the transistor 12. The 1T/1C cell 10 is read by applying a signal to the gate 16 of the transistor (word line WL, e.g., the Y signal), thereby connecting the bottom electrode of the capacitor 14 to the bit line 18 (BL). A pulse signal is then applied to the top electrode contact (the plate line or drive line DL) 20. The potential on the bit line 18 of the transistor 12 is, therefore, the capacitor charge divided by the bit line capacitance. Since the capacitor charge is dependent upon the bi-stable polarization state of the ferroelectric material, the bit line potential can have two distinct values. A sense amplifier (not shown) is connected to the bit line 18 and detects the voltage associated with a logic value of either 1 or 0. Frequently the sense amplifier reference voltage is a ferroelectric or non-ferroelectric capacitor connected to another bit line that is not being read. In this manner, the memory cell data is retrieved.

A characteristic of the illustrated ferroelectric memory cell is that, if the polarization of the ferroelectric is switched, the read operation is destructive and the sense amplifier must rewrite (onto that cell) the correct polarization value after the cell is read. This is similar to the operation of a DRAM. One difference from a DRAM is that a ferroelectric memory cell will retain its state until it is interrogated, thereby eliminating the need of refresh.

As illustrated in prior art FIG. 2, a 2T/2C memory cell 30 couples to a bit line 32 and an inverse of the bit line ("bit line-bar") 34 that is common to many other memory types (for example, static random access memories). Memory cells of a memory block are formed in memory rows and memory columns. The dual capacitor ferroelectric memory cell comprises two transistors 36 and 38 and two ferroelectric capacitors 40 and 42, respectively. The first transistor 36 couples between the bit line 32 and a first capacitor 40, and the second transistor 38 couples between the bit line-bar 34 and the second capacitor 42. The first and second capacitors 40 and 42 have a common terminal or plate (the drive line DL) 44 to which a signal is applied for polarizing the capacitors.

In a write operation, the first and second transistors 36 and 38 of the dual capacitor ferroelectric memory cell 30 are enabled (e.g., via their respective word line 46) to couple the capacitors 40 and 42 to the complementary logic levels on the bit line 32 and the bit line-bar line 34 corresponding to a logic state to be stored in memory. The common terminal 44 of the capacitors is pulsed during a write operation to polarize the dual capacitor memory cell 30 to one of the two logic states.

In a read operation, the first and second transistors 36 and 38 of the dual capacitor memory cell 30 are enabled via the word line 46 to couple the information stored on the first and second capacitors 40 and 42 to the bit line 32 and the bit line-bar line 34, respectively. A differential signal (not shown) is thus generated across the bit line 32 and the bit line-bar line 34 by the dual capacitor memory cell 30. The differential signal is sensed by a sense amplifier (not shown) that provides a signal corresponding to the logic level stored in memory.

There are several techniques to interrogate a FeRAM cell. The two most common interrogation techniques are step sensing and pulse sensing. In both these interrogation techniques, the cell capacitor is coupled to the complementary bit line by turning ON an access or a pass gate. In step sensing, the plate line voltage is stepped from ground (Vss) to a supply voltage (Vdd). In pulse sensing, the plate line voltage is pulsed from Vss to Vdd and then back to Vss. This provides a differential voltage on the bit line pair, which is connected to a sense amp circuit. The reference voltage is typically supplied at an intermediate voltage between a voltage ($V_{``0"}$) associated with a capacitor programmed to a binary "0" and that of the capacitor programmed to a binary "1" ($V_{``1"}$). The resulting differential voltage at the sense amp terminals represents the data stored in the cell, which is buffered and applied to a pair of local I/O lines.

The transfer of data between the ferroelectric memory cell, the sense amp circuit, and the local data bit lines is controlled by various access transistors, typically MOS devices, with switching signals being provided by control circuitry in the device. In a typical ferroelectric memory read sequence, two sense amp bit lines are initially pre-charged to ground, and then floated, after which a target ferroelectric memory cell is connected to one of the sense amp bit lines and interrogated. Thereafter, a reference voltage is connected to the remaining sense amp bit line, and a sense amp senses the differential voltage across the bit lines and latches a voltage indicative of whether the target cell was programmed to a binary "0" or to a "1".

In modern memory devices having millions of data cells, there is a continuing need to reduce component sizes and otherwise to conserve circuit area in the device, so as to maximize device density.

SUMMARY

The following presents a simplified summary in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the invention in a simplified form as a prelude to the more detailed description that is presented later.

One aspect of the invention relates to a method of manufacturing an integrated circuit comprising forming an array of ferroelectric memory cells on a semiconductor substrate, heating the substrate to a temperature near a Curie temperature of the ferroelectric cores, and subjecting the substrate to a temperature program, whereby thermally induced stresses on the ferroelectric cores cause a switched polarization of the cores to increase by at least about 25% as the cores cool to about room temperature. In accordance with the invention, the term ferroelectric core refers to the ferroelectric material that may serve as a dielectric within a ferroelectric capacitor.

Typically, a ferroelectric material undergoes a crystal phase transition as it drops below the Curie temperature. Above the Curie temperature, the domains are generally symmetric and exhibit paraelectric properties (no ferroelectric behavior). Below the Curie temperature, the crystal becomes tetragonal and the domains become generally asymmetric, wherein the material exhibits spontaneous polarization that facilitates ferroelectric switching properties. Ordinarily, the domains are randomly oriented, meaning that only about ⅓ are functionally aligned with respect to a ferroelectric capacitor. As the substrate cools, thermal stresses are created due to the mismatched coefficients of thermal expansion in layers adjacent the ferroelectric core. According to the invention, the thermal stresses are large enough and the cooling occurs slowly enough that a significant portion of the domains reorient to relieve thermal stresses. The resulting ferroelectric cores have a higher switched polarization than ferroelectric cores found in prior art integrated circuits. The higher switched polarization allows the memory cells to be made smaller and more densely packed.

Another aspect of the invention relates to an array of ferroelectric memory cells, each cell comprising a capacitor stack having a ferroelectric core, the ferroelectric cores having asymmetric domains with one axis of polarity, wherein from about 40 to about 90% of the domains are functionally oriented with respect to the capacitor stack. According to a further aspect of the invention, metal plugs filling vias in a dielectric layer over the ferroelectric cores have an area about equal to or greater than that of the ferroelectric cores. The metal in the vias adds to the thermal stresses that reorient the domains during cooling.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF EXAMPLE EMBODIMENTS

The invention will now be described with reference to the accompanying drawings in which like numbered elements represent like parts. The invention can be used to fabricate stand-alone FeRAM devices or FeRAM devices integrated into a semiconductor chip that has many other device types.

Figure 1:
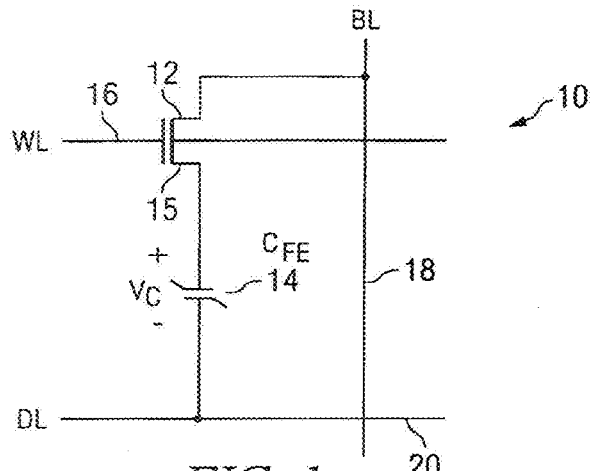
FIG. 1 (Prior Art) is a schematic diagram illustrating an example of a prior art 1T/1C FeRAM memory cell.
Figure 2:
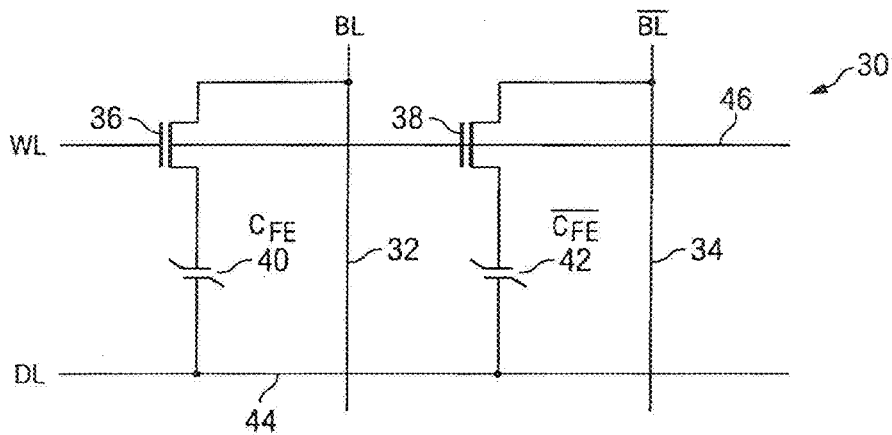
FIG. 2 (Prior Art) is a schematic diagram illustrating an example of a prior art 2T/2C FeRAM memory cell.
Figure 3:
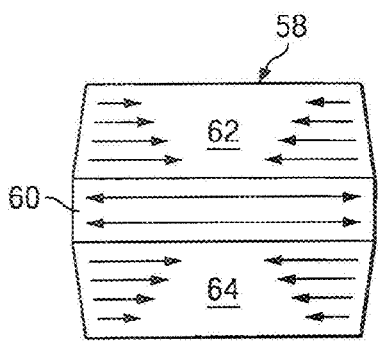
FIG. 3 is schematic illustration of a stack around a ferroelectric core according to one aspect of the invention.

FIG. 3 provides a schematic illustrating how stresses are applied according to the invention to reorient the domains of a ferroelectric core 60. A stack 58 comprising the ferroelectric core 60, a material 62 above the ferroelectric core 60 and a material 64 below the ferroelectric core 60. The materials are stacked in the z-direction. One of, and preferably both of, the materials 62 and 64, have a larger coefficient of thermal expansion (CTE) than the ferroelectric core 60. As the materials are cooled below the temperatures at which they were formed, the materials 62 and 64 shrink faster than the ferroelectric core 60 and, through shear stresses, exert a compressive force on the ferroelectric core 60 in the x-y plane. FIG. 3 illustrates the compressive forces caused by contraction within the materials 62 and 64, and the counterforce within the ferroelectric core 60 caused by its resistance to compression. Where the ferroelectric core 60 comprises domains that are asymmetric, being thinner in a cross-section perpendicular to a c-axis, the compressive force drives the domains to reorient to align the c-axis with the z-axis of the stack 58. If the c-axis is the axis of polarity for the ferroelectric material, this results in a functional alignment of the domains with the stack 58.

The material 62 and 64, in one example, can comprise one or more layers. These layers can be otherwise functional layers, such as barriers layers, electrode layers, etch stop layers, hard mask layers, and metal plugs. Preferably, one of layers 62 and 64, and more preferably both of these layers, have about the same area in the x-y plane, or a greater area in the x-y plane, than the ferroelectric core 60.

Preferably, one or both of the materials 62 and 64 have a higher CTE than the ferroelectric core 60. A higher CTE is generally at least about 4.0 ppm/° C., preferably at least about 8.0 ppm/° C., and more preferably at least about 16.0 ppm/° C.

Preferably, one or both of the materials 62 and 64 have a high Young's modulus. Materials with a high Young's modulus do not stretch easily and can exert more stress for a given CTE and temperature change. A high Young's modulus is preferably at least about 80 GPa, more preferably at least about 200 GPa, still more preferably at least about 400 GPa.

Preferably, one or both of the materials 62 and 64 is thick compared to the ferroelectric core 60. A thick layer can exert more overall force than a thin layer. In addition, a thick layer is less likely to be itself compressed by other layers surrounding it. A thick layer compared to the ferroelectric core 60 is preferably at least about 0.3 μm thick, more preferably at least about 0.6 μm thick, still more preferably at least about 1.0 μm thick.

Preferably, one or both of the materials 62 and 64 and the ferroelectric core 60 are deposited substantially above the Curie temperature of the ferroelectric core 60. The higher the temperature at which these materials are deposited, the greater the thermal stresses that build up by the time the materials have cooled to the Curie temperature. A temperature substantially above the Curie temperature is preferably at least about 50° C. above the Curie temperature, more preferably at least about 100° C. above the Curie temperature, still more preferably at least about 150° C. above the Curie temperature.

Examples of Curie temperatures are 230° C. for $PbZrO_3$ and 490° C. for $PbTiO_3$. These are both types of PZT. By varying the ratio between Zr and Ti, any Curie temperature in the range from about 230° C. to about 490° C. can be set. Additional examples of Curie temperatures are 365° C. for $NaNbO_3$, 418° C. for $KNbO_3$, 480° C. for $NaTaO_3$, −223 to −213° C. for $CaTiO_3$, 130° C. for $BaTiO_3$, 163° C. for $PbHfO_3$, 585° C. for $CdHfO_3$, and 850° C. for $BiFeO_3$.

Notwithstanding the foregoing preferences for achieving high shear stresses, if the shear stresses become too high, delamination or cracking may occur. Therefore, in a system according to the invention, it is desirable that the thermal stresses become as high as possible using CTE mismatch, Young's modulus, layer thickness, and deposition temperature, but all subject to the stresses not becoming so high as to cause mechanical failure. Accordingly, it is also desirable to select the materials for good adhesion and strength.

Even with very high thermal stresses, a substantial reorientation of domains will not occur unless sufficient time is allowed at a sufficiently high temperature. Energy is released when domains reorient under stress, however, an energy barrier must be overcome and an activation energy must be supplied for domains to reorient. This activation energy is supplied thermally while the material is heated. For fixed stress, the rate of reorientation is highest just below the Curie temperature.

A temperature program refers to a time variation in temperature. A wide variety of temperature programs may be appropriate for reorienting domains under thermally induced stresses. One example is a slow steady cooling. Another example is temperature cycling. A further example is a long hold at one temperature or a series of holds at a series of temperatures. In any event, the domain orientations randomize when the material is heated above the Curie temperature and therefore the relevant temperature program generally begins with cooling past the Curie temperature. Preferably, after dropping to the Curie temperature, the stack 58 is kept within about 100° C. of the Curie temperature for at least about 40 minutes, more preferably at least about 100 minutes, still more preferably at least about 150 minutes. Diffusion of dopants, in source/drain regions for example, tends to occur during long holds at higher temperatures, but those effects can be mitigated or accepted.

An appropriate temperature cycle can be determined experimentally or theoretically. Using a theoretical approach, the thermal stress can be calculated, for example, by finite element modeling. The rate of reorientation can be determined using mechanical stresses created under laboratory conditions. In a laboratory, a driving force for reorientation can also be created using an electrical field. The reorientation rate under mechanical stress can be related to the reorientation rate under an electrical field by comparing the amount of energy released upon reorientation. A temperature program can then be calculated to minimize, for example, the time integral of the absolute temperature squared required to achieve a given degree of reorientation.

The degree of reorientation can be determined by measuring the switched polarization. If the material has a switched polarization that would be measured with randomly oriented domains, 33% of the domains are, by definition, functionally oriented. If the switched polarization were three times that amount, we would say that 100% of the domains were functionally oriented. Preferably, after the temperature program, at least about 40% of the domains are functionally oriented, more preferably at least about 45%, still more preferably at least about 50%. Preferably, the switched polarization increases by at least about 25% during the temperature program, more preferably by at least about 50%. In accordance with the invention, for ferroelectric material in the (001) family (e.g., (100), (010) and (001)), functionally oriented domains means that the polarization vector is parallel to the ferroelectric capacitor; that is parallel to the z-axis or vertical direction of the vertically stacked ferroelectric capacitor.

Figure 4:
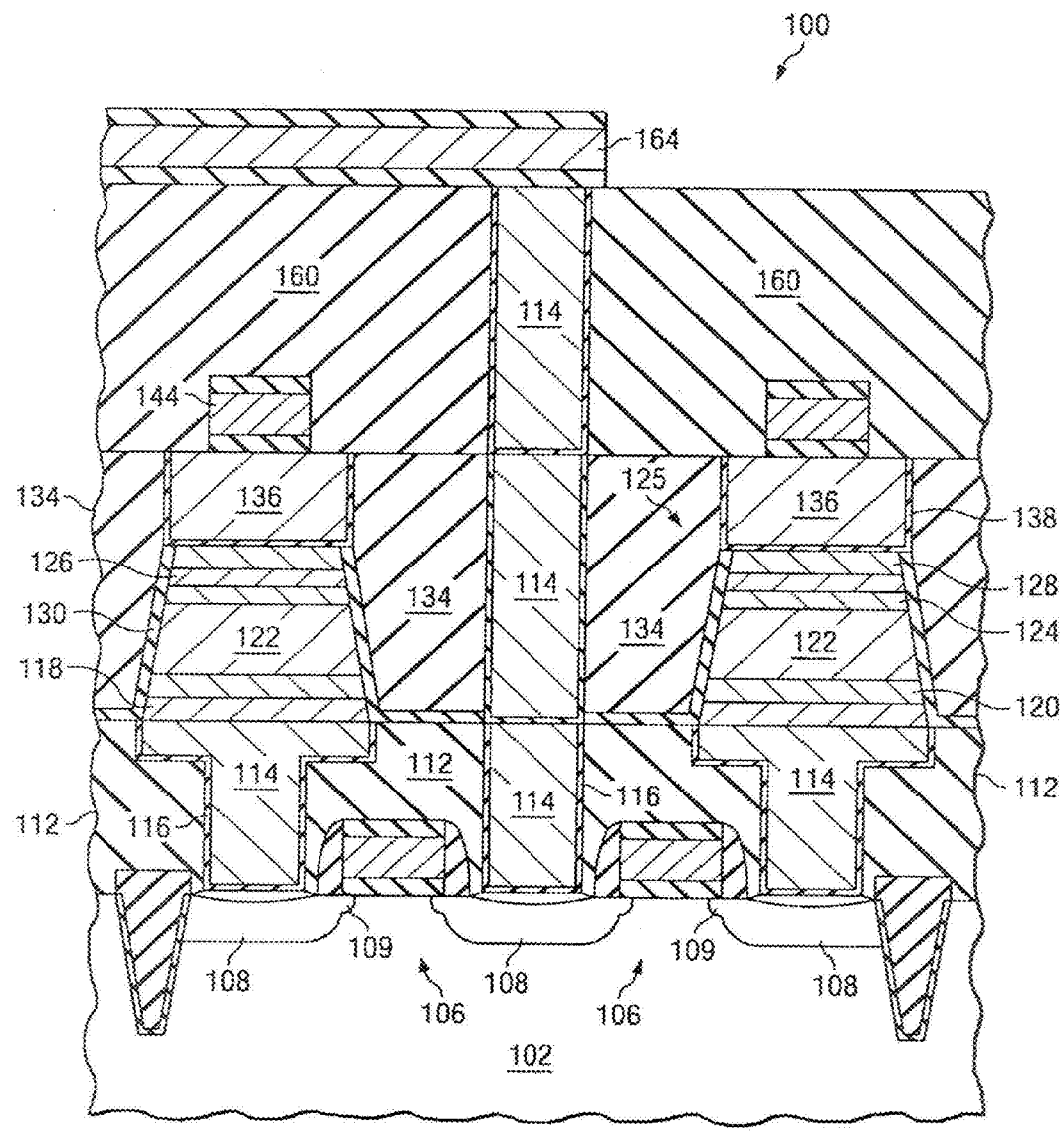
FIG. 4 is a schematic fragmentary cross-sectional view of a partially fabricated device containing FeRAM capacitors and associated structures in accordance with another aspect of the invention.

FIG. 4 is a fragmentary cross-sectional view, with schematically illustrated structures, showing a partially fabricated semiconductor device 100 with FeRAM. The semiconductor device 100 is used to illustrate several ways in which the invention can be implemented within an integrated circuit.

The semiconductor device 100 includes gate structures 106, which comprise a gate dielectric (for example, comprising silicon dioxide, an oxynitride, a silicon nitride, BST, PZT, a silicate, any other high-k material, or any combination or stack thereof) and a gate electrode (for example, comprising polycrystalline silicon doped either p-type or n-type with a silicide formed on top, or a metal such as titanium, tungsten, TiN, tantalum, TaN or other type metal). Source/drain regions 108 are formed in semiconductor substrate 102 by, for example, implantation using conventional dopants and processing conditions. Lightly doped drain extensions 109, as well as pocket implants, may also be utilized. Source/drain regions 108 may be silicided.

From time to time throughout this specification and the claims that follow, a layer or structure may be described as being of a substance such as "aluminum", "tungsten", "copper", "silicon nitride", etc. These descriptions are to be understood in context and as they are used in the semiconductor manufacturing industry. For example, in the semiconductor industry, when a metallization layer is described as being aluminum, it is understood that the metal of the layer comprises elemental aluminum as a principle component, but the elemental aluminum may be, and typically is, alloyed, doped, or otherwise impure. As another example, silicon nitride may be a silicon rich silicon nitride or an oxygen rich silicon nitride. Silicon nitride may contain some oxygen, but not so much that the material's dielectric constant is substantially different from that of high purity stoichiometric silicon nitride.

A dielectric layer 112 is formed over the entire substrate 102. The dielectric layer 112 comprises, for example, $SiO_2$ (doped or undoped with preferable dopants such as boron or phosphorous), possibly with a layer of hydrogen or deuterium containing silicon nitride next to the gate. The dielectric layer 112 is patterned and etched so as to form openings for contacts to the substrate and gate structures 106.

Some of these contacts 114 connect with capacitor stacks 125. In this example, these contacts 114 are made wider at the top so that their width is greater than or equal to the width of the ferroelectric cores 122 of the capacitor stacks 125, whereby the conductive material 114 can more effectively exert compressive forces that are transmitted to the ferroelectric cores 122. The broadened tops of the openings can be achieved, for example, using a two mask etch process to pattern the dielectric layer 112.

The openings are filled with one or more layers of conductive materials to form plugs 114. Examples of conductive materials include tungsten, molybdenum, titanium, titanium nitride, tantalum nitride, or a metal silicide such as Ti, Ni or Co, copper and doped polysilicon. A liner/barrier layer 116 may optionally be formed between the plugs 114 and dielectric 112. A liner/barrier layer can be, for example, Ti, TiN, TaSiN, Ta, TaN, TiSiN, or a stack thereof.

FeRAM capacitor stacks 125 are formed above the conductive plugs 114. These stacks comprise a barrier layer 118, a bottom electrode layer 120, the ferroelectric core 122, a top electrode layer 124, another diffusion barrier layer 126, and, optionally, a hard mask layer 128. Ordinarily, each of these layers are made as thin as possible to keep the capacitor stack 125 short. According to the invention, one or more of these layers (other than the ferroelectric core 122 itself) can be made extra thick to add additional compressive forces to the ferroelectric core 122. In particular, the bottom electrode 120 and the top electrode 124 are good candidates because they are immediately adjacent to the ferroelectric core 124 and generally have high CTE and high Young's modulus. For example, the Young's modulus of an Iridium electrode is about 528 GPa.

Optionally, the bottom electrode 120 is formed directly over the metal plug 114, however, the diffusion barrier layer 118 may be desirable to prevent oxygen from diffusing through the bottom electrode 120. Where the bottom electrode layer 120 is extra thick, the need for such a diffusion barrier may be reduced or eliminated.

The bottom electrode diffusion barrier layer 118 is of an electrically conductive material and may comprise one or more layers. Suitable materials include, for example, TiAlON, TiAlN, TaSiN, TiSiN, TaAlN, Ti, TiN, Ta, TaN, HfN, ZrN, HfAlN, CrN, TaAlN, and CrAlN. These layers may be deposited by any suitable process, including, for example, reactive sputter deposition using Ar+$N_2$ or Ar+$NH_3$, CVD, or plasma enhanced CVD. The diffusion barrier layer 118 is ordinarily from about 50 nm to about 90 nm thick.

The next layer is the bottom electrode 120. This layer generally needs to be oxygen-stable in view of the conditions used for the subsequent deposition of the ferroelectric core 122. Ordinarily, the bottom electrode 120 is from about 30-100 nm thick and comprised of one or more layers of noble metal or conductive oxide such as iridium, iridium oxide, Pt, Pd, PdOx, Au, Ru, $RuO_x$, Rh, $RhO_x$, IrPt alloys, (Ba,Sr,Pb)$RuO_3$, (Sr,Ba,Pb)$IrO_3$, $RLaSrCoO_3$, (Ba,Sr)$RuO_3$, $LaNiO_3$. In one embodiment, the bottom electrode 120 comprises an Ir/$IrO_2$ bi-layer.

For a PZT ferroelectric, it is preferred to have oxide layers such as IrOx layers in contact with the ferroelectric. In addition, it is preferred to have a noble metal layer in contact with the top and bottom diffusion barriers. Therefore, the electrodes are preferably both metal/metal oxide bi-layers. The noble metal prevents oxidation of the diffusion barrier and the resulting formation of an insulating layer that increases undesirably the contact resistance. The thickness of this noble metal layer is ordinarily from about 10 to about 50 nm. If the bottom electrode 120 is thickened to provide greater thermal stresses on the ferroelectric core 122, it is generally preferred to thicken the metal portion of a metal/metal oxide bi-layer electrode. In one embodiment, the bottom electrode layer 120 is at least about 200 nm thick to provide greater thermal stresses.

The ferroelectric core 122 is formed on the bottom electrode 120, as illustrated in FIG. 4. Preferably, the ferroelectric core is less than about 100 nm thick, more preferably less than about 50 nm thick, and still more preferably less than about 30 nm thick. The thinner the ferroelectric core, the more easily its switched polarization can be increased by thermal stresses. Moreover, the higher switched polarizations achievable according to the invention allow the ferroelectric core 122 to be made thinner. The material of the ferroelectric core 122 can be, for example, Pb(Zr,Ti)$O_3$ (PZT, lead zirconate titanate); doped PZT with donors (Nb, La, Ta) and/or acceptors (Mn, Co, Fe, Ni, Al); PZT doped and alloyed with $SrTiO_3$, $BaTiO_3$ or $CaTiO_3$; strontium bismuth tantalate (SBT) and other layered perovskites such as strontium bismuth niobate tantalate (SBNT) or bismuth titanate, $BaTiO_3$, $PbTiO_3$, $Bi_2TiO_3$; etc. PZT is a desirable choice for the capacitor dielectric because it has the highest switched polarization and the lowest processing temperature of the aforementioned materials. Because PZT has the largest switched polarization, it is also possible to minimize capacitor area using such material.

The preferred deposition technique for these ferroelectric materials is metal organic chemical vapor deposition (MOCVD). MOCVD is preferred especially for thin films (<100 nm). MOCVD also permits the film thickness to be scaled without significant degradation of the switched polarization and coercive field, yielding PZT films with a low operating voltage and large switched polarization values. In addition, the reliability of the MOCVD PZT film is better than that generally obtained using other deposition techniques, particularly with respect to imprint/retention. Preferably, the PZT film is formed at a temperature of at least about 600° C., more preferably, least about 625° C.

The top electrode 124 is formed on the ferroelectric core 122. For Pb based ferroelectrics, it is preferred to have a conductive oxide top electrode such as $IrO_x$, $RuO_x$, $RhO_x$, $PdO_x$, $PtO_x$, $AgO_x$, (Ba,Sr)$RuO_3$, $LaSrCoO_3$, $LaNiO_3$, $YBa_2Cu_3O_{7-x}$ rather than a noble metal in order to minimize degradation due to many opposite state write/read operations (fatigue). Many of the Bi ferroelectrics such as SBT can also use noble metal electrodes such as Pt, Pd, Au, Ag, Ir, Rh, and Ru and still retain good fatigue characteristics.

If the top electrode is an oxide it is preferred to have a noble metal layer above it in order to maintain low contact resistance between the top metal contact and the oxide. For example, it is possible that a TiN in contact with IrOx might form $TiO_2$, which is insulating, during subsequent thermal processing.

For PZT electrodes (electrodes bounding a PZT ferroelectric core), ordinarily the top electrode comprises about 20 nm Ir deposited by PVD in Ar on about 30 nm IrOx deposited by reactive PVD in Ar+$O_2$. In one embodiment, however, the top electrode 124 is at least about 200 nm thick to provide greater thermal stresses on the ferroelectric core 122.

The hard mask 128 is preferably used to pattern the entire capacitor stack. The hard mask may comprise, for example, one or more layers of TiN, TiON, TiAlN, or TiAlON. All or part of the hard mask may be removed during the etch process. Therefore, the thickness of the hard mask The capacitor stack 125 is contained and protected by sidewall diffusion barrier 130. The diffusion barrier 130 prevents contamination by lead and reaction between a PZT dielectric core and interlayer dielectric 134. Suitable materials include, for example, one or more layers of AlOx, TaOx, AlN, SiN, $TiO_2$, $ZrO_2$, and $HfO_2$. The thickness is typically from about 8 nm to about 120 nm, usually about 10 nm to about 20 nm. In the invention, the via for metal 136 over the capacitor stack 125 is preferably etched to the width of the capacitor stack 125 or wider. For this reason, it may be desirable for the diffusion barrier layer 130 to function as an etch stop. The example materials given above can fill that purpose, however, some additional thickness may be required. Generally, the barrier layer 130 is removed from the top of the capacitor stack 125 by etching.

An interlevel dielectric 134 is formed over the capacitor stack 125. The material for the interlevel dielectric can be, for example, a silicon oxide, FSG, PSG, BPSG, PETEOS, HDP oxide, a silicon nitride, silicon oxynitride, silicon carbide, silicon carbo-oxy-nitride, a low dielectric constant material (for example, SiLK, porous SiLK, teflon, low-k polymer (possibly porous), aerogel, xerogel, BLACK DIAMOND, HSQ, or any other porous glass material), or a combination or stack thereof.

The plugs 136 extend through the dielecteric 134 to make contact down to the ferroelectric capacitors, and comprise a metal. Suitable metals include, for example, copper, aluminum, titanium, and tungsten. A barrier/liner 138 may be formed between the metal and the adjacent interlevel dielectric. Suitable materials for a barrier/liner include, for example, one or more layers of Ti, TiN, W, tungsten nitride, Ta, tantalum nitride. Preferably, the plugs 136 and the barrier/liner 138 are either W with TiN diffusion barriers or Cu with TaN, TaSiN, Ta, TiN, WN, or TiSiN diffusion barriers. Tungsten can be deposited by CVD. Copper can be formed by first depositing a Cu seed by enhanced sputter deposition or CVD followed by Cu plating.

Regardless of which process or metal is used, the interlevel dielectric 134 is etched to form vias of a suitable size. According to the one aspect of the invention, the vias are formed so that the metal plugs 136 cover an area about as great, or greater, than the ferroelectric core 122 or the capacitor stack 125 (both roughly the same). This can be accomplished by an accurate lithography process. Alternatively, a less accurate process can be used if the diffusion barrier 130 is an effective etch stop. Another approach is to form the dielectric layer 134 in two steps. In the first step, the dielectric is deposited to the height of the capacitor stack 125. The dielectric is then planarized with the top of the stack, by CMP for example. An etch stop layer is then formed and patterned to electrically isolate the various features. The remainder of the dielectric 134 is then deposited and patterned to form vias of the desired width.

Layers 144 and 164 are additional metal layers that provide electrical connectivity. Layer 160 is another interlevel dielectric. The formation and structure of these layer does not generally have a substantial effect on the thermal stresses on the ferroelectric core 122.

Although the invention has been shown and described with respect to a certain aspect or various aspects, it is obvious that equivalent alterations and modifications will occur to others skilled in the art upon the reading and understanding of this specification in conjunction with the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated example embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of manufacturing an integrated circuit, comprising:
    forming a first contact plug over a substrate;
    forming a FeRAM capacitor stack over the first contact plug, including:
        forming a bottom electrode layer over the first contact plug;
        forming a PZT ferroelectric core over the bottom electrode layer; and
        forming a top electrode layer over the PZT ferroelectric core; and
    forming a second contact plug over the top electrode layer;
    wherein the first and second contact plugs comprise materials having coefficients of thermal expansion larger than a coefficient of thermal expansion of the PZT ferromagnetic core; the first and second contact plugs have areas perpendicular to a stack axis that are about the same as or greater than a corresponding area of the PZT ferroelectric core; the first and second contact plugs are deposited at temperatures at least about 50° C. above a Curie temperature of the PZT ferromagnetic core; and the stack is cooled using a temperature program that cools the stack past the Curie temperature and, after dropping to the Curie temperature, keeps the stack within about 100° C. of the Curie temperature for at least about 40 minutes.

2. The method of claim 1, wherein the temperature program comprises keeping the PZT ferroelectric core within about 100° C. of the Curie temperature for at least about 100 minutes.

3. The method of claim 1, wherein the temperature program comprises keeping the PZT ferroelectric core within about 50° C. of the Curie temperature for at least about 50 minutes.

4. The method of claim 1, wherein the PZT ferroelectric cores is formed at a temperature of at least about 600° C.

5. The method of claim 1, wherein the bottom and top electrode comprise iridium and are at least about 200 nm thick.

6. The method of claim 1, wherein the first and second contact plugs comprise tungsten.

7. The method of claim 6, wherein the PZT ferroelectric core is formed by metal organic chemical vapor deposition at a temperature of at least about 600° C.; and the bottom electrode layer and top electrode layer comprise Ir/IrOx bilayers.

8. The method of claim 1, further comprising forming a first barrier layer between the first contact plug and the bottom electrode layer; and forming a second barrier layer between the top electrode layer and the second contact plug.

9. The method of claim 8, wherein the first and second barrier layers comprise TiAlN.

10. The method of claim 1, wherein forming the first contact plug comprises forming a first dielectric layer over the substrate, patterning and etching the first dielectric layer to form a first opening having a wider top portion, and filling the first opening with material comprising metal.

11. The method of claim 10, wherein the first dielectric layer comprises $SiO_2$ and the metal comprises tungsten.

12. The method of claim 11, wherein forming the second contact plug comprises forming a second dielectric layer over the stack, patterning and etching the second dielectric layer to form a second opening, and filling the second opening with material comprising tungsten.

13. A method of manufacturing an integrated circuit, comprising:
   forming a first dielectric layer over a substrate,
   forming a first contact plug within the first dielectric layer;
   forming a FeRAM capacitor stack over the first contact plug, including:
      forming a bottom electrode layer over the first contact plug;
      forming a PZT ferroelectric core over the bottom electrode layer; and
      forming a top electrode layer over the PZT ferroelectric core; and
   forming a second contact plug over the top electrode layer;
   wherein the first dielectric layer comprises SiO$_2$; the first and second contact plugs comprise tungsten; the bottom and top electrode layers comprise Ir/IrOx bilayers; the first and second contact plugs have areas perpendicular to a stack axis that are about the same as or greater than a corresponding area of the PZT ferroelectric core; the first and second contact plugs are deposited at temperatures at least about 50° C. above a Curie temperature of the PZT ferromagnetic core; the PZT ferroelectric core is formed at a temperature of at least about 600° C.; and the stack is cooled using a temperature program that cools the stack past the Curie temperature and, after dropping to the Curie temperature, keeps the stack within about 100° C. of the Curie temperature for at least about 40 minutes.

14. The method of claim 13, wherein forming the second contact plug comprises forming a second dielectric layer over the first dielectric layer; and forming the second contact plug within the second dielectric layer.

15. The method of claim 14, wherein forming the first contact plug comprises forming the first dielectric layer over the substrate, patterning and etching the first dielectric layer to form a first opening having a wider top portion, and filling the first opening with tungsten.

16. The method of claim 15, further comprising forming a first barrier layer between the first contact plug and the bottom electrode layer; and forming a second barrier layer between the top electrode layer and the second contact plug.

17. The method of claim 16, wherein the first and second barrier layers comprise TiAlN.

18. The method of claim 13, wherein the temperature program comprises keeping the PZT ferroelectric core within about 100° C. of the Curie temperature for at least about 100 minutes.

19. The method of claim 18, wherein the temperature program comprises keeping the PZT ferroelectric core within about 50° C. of the Curie temperature for at least about 50 minutes.

20. The method of claim 13, wherein the first and second contact plugs are at least twice as thick as the PZT ferroelectric core.

* * * * *